United States Patent
Su et al.

(10) Patent No.: US 10,211,214 B2
(45) Date of Patent: Feb. 19, 2019

(54) SEMICONDUCTOR DEVICE HAVING MILTI-HEIGHT STRUCTURE AND METHOD OF MANUFACTURING THE SAME

(71) Applicant: TAIWAN SEMICONDUCTOR MANUFACTURING CO., LTD., Hsinchu (TW)

(72) Inventors: Kuan-Wei Su, Kaohsiung (TW); Yung-Lung Hsu, Tainan (TW); Chih-Hsun Lin, Tainan (TW); Kun-Tsang Chuang, Miaoli County (TW); Chiang-Ming Chuang, Changhua County (TW); Chia-Yi Tseng, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/456,820

(22) Filed: Mar. 13, 2017

(65) Prior Publication Data

US 2018/0261609 A1 Sep. 13, 2018

(51) Int. Cl.
| | |
|---|---|
| *H01L 27/115* | (2017.01) |
| *H01L 27/11521* | (2017.01) |
| *H01L 29/49* | (2006.01) |
| *H01L 29/788* | (2006.01) |
| *H01L 23/31* | (2006.01) |
| *H01L 23/29* | (2006.01) |
| *H01L 27/11526* | (2017.01) |

(Continued)

(52) U.S. Cl.
CPC ...... *H01L 27/11521* (2013.01); *H01L 23/291* (2013.01); *H01L 23/3171* (2013.01); *H01L 27/11526* (2013.01); *H01L 29/42328* (2013.01); *H01L 29/4916* (2013.01); *H01L 29/66825* (2013.01); *H01L 29/788* (2013.01)

(58) Field of Classification Search
CPC ......... H01L 27/11521; H01L 27/11526; H01L 29/66825; H01L 29/42328; H01L 29/788; H01L 29/4916; H01L 23/3171; H01L 23/291

See application file for complete search history.

(56) References Cited

U.S. PATENT DOCUMENTS 9,947,759 B1 * 4/2018 Lin ...................... H01L 29/4983
2009/0294826 A1 * 12/2009 Hong ................ H01L 27/11519
257/316

* cited by examiner

*Primary Examiner* — Kyoung Lee
*Assistant Examiner* — Christina Sylvia
(74) *Attorney, Agent, or Firm* — McClure, Qualey & Rodack, LLP (57) ABSTRACT

A semiconductor device having semiconductor device having a multi-height structure is provided. The semiconductor device having a multi-height structure includes a silicon substrate. A first structure and a second structure are respectively disposed on the silicon substrate and connected to each other. A limiting block is disposed on the second structure and near an edge of the second structure beside the first structure. A bottom anti-reflection coating (BARC) layer blanketly covering the first structure, the second structure and the limiting block, in which the BARC layer comprises a low-viscosity material, and the BARC layer overlying the top surface of the second structure has an external surface substantially parallel to the top surface of the second structure. Control gates are disposed on the external surface of the BARC layer.

20 Claims, 9 Drawing Sheets

(51) Int. Cl.
*H01L 29/423* (2006.01)
*H01L 29/66* (2006.01)

SEMICONDUCTOR DEVICE HAVING MILTI-HEIGHT STRUCTURE AND METHOD OF MANUFACTURING THE SAME

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate flash memory cells. Split gate flash memory cells are semiconductor devices, typically formed as part of integrated circuits. Recently, split gate flash memory cells have received great attention due to the development of high memory capacities (relative to other types of flash memory cells). Split gate flash memory cells have several advantages over stacked gate memory cells, such as lower power consumption, higher injection efficiency, less susceptibility to short channel effects, and over erase immunity.

However, when a bottom anti-reflection coating (BARC) layer includes a low-viscosity material, the BARC layer has a thinner thickness near an edge of a functional area. An external surface of the BARC layer overlying various features shows a steep slope from a central portion to the edge of the functional area, so that the external surface cannot be parallel to the top surface of the underlying features along a horizontal dot-line. The uneven thickness of the BARC layer causes the overlying control gates near the edge of the functional area to slide down, resulting in worse critical dimension uniformity (CDU) within the functional area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a semiconductor device having a multi-height structure including a first structure having a first height and a second structure having a second height greater than the first height, in which a limiting block acts as a retaining wall to hold or restrain more BARC layer on the second structure, thereby preventing the BARC layer flowing down from a top surface of the second structure.

Figure 1A:
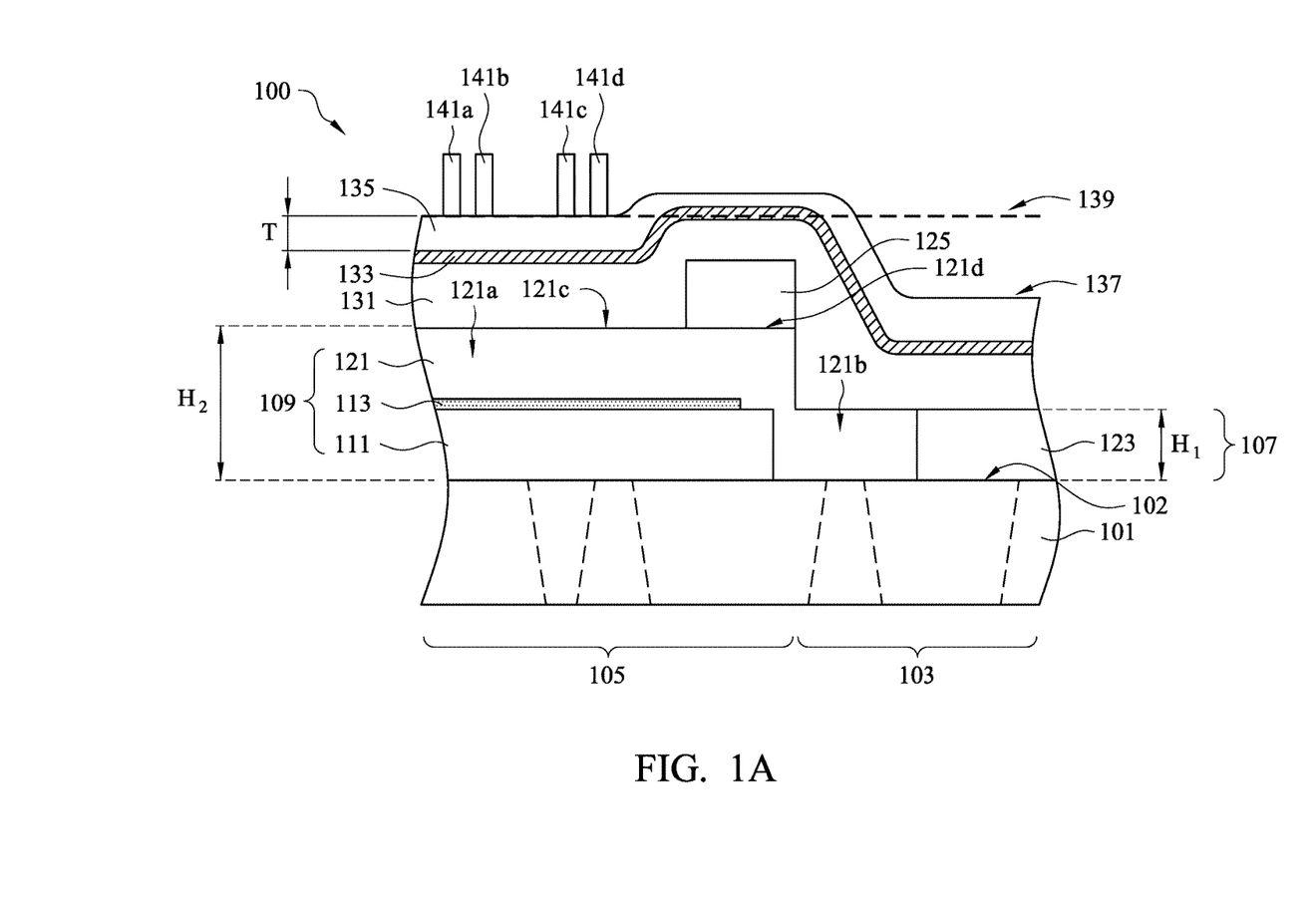
FIG. 1A and FIG. 1B are schematic cross-sectional views of a semiconductor device having a multi-height structure in accordance with various embodiments.

In some embodiments, as shown in FIG. 1A, which is a schematic cross-sectional view of a semiconductor device having a multi-height structure in accordance with various embodiments.

Briefly, in FIG. 1A, a semiconductor device 100 may include a silicon substrate 101. A first structure 107 and a second structure 109 are respectively disposed on the silicon substrate 101 and connected to each other. A limiting block 125 is disposed on an edge 121*d* of a top surface 121*c* of the second structure 109 beside the first structure 107. A bottom anti-reflection coating (BARC) layer 135 blanketly covers the first structure 107, the second structure 109 and the limiting block 125. Control gates 141*a*, 141*b*, 141*c* and 141*d* are disposed on an external surface 137 of the BARC layer 135.

As shown in FIG. 1A, in certain embodiments, the silicon substrate 101 may be defined into two functional areas including a first functional area 103 and a second functional area 105, in which the first functional area 103 may be defined as a logic cell area, and the second functional area 105 may be defined as a flash cell area, for examples. However, in other embodiments, the first functional area 103 and the second functional area 105 may be other functional areas rather than the aforementioned definitions. In those embodiments, depending actual requirements, the silicon substrate 101 may include structures such as shallow trench isolations (STIs; not shown in the figures) to define areas for active devices, sometimes referred as OD areas (not shown in the figures).

As shown in FIG. 1A, in some embodiments, the first structure 107 may be disposed on the silicon substrate 101. In certain embodiments, the first structure 107 may include a low-gate polysilicon layer 123 disposed above the first functional area 103 of the silicon substrate 101. In these embodiments, the first structure 107 may have a first height $H_1$ from an upper surface 102 of the silicon substrate 101 to a top surface (not shown in the figures) of the low-gate polysilicon layer 123.

As shown in FIG. 1A, in some embodiments, the second structure 109 may be disposed on the silicon substrate 101 and adjacent to the first structure 107. In certain embodiments, the second structure 109 may include a floating gate polysilicon layer 111 disposed on the silicon substrate 101, and a high-voltage polysilicon layer 121 disposed on the floating gate polysilicon layer 111. In some examples, a dielectric layer 113 may be optionally disposed between the high-voltage polysilicon 121 and the floating gate polysilicon layer 111. The high-voltage polysilicon layer 121 may have a first portion 121a disposed on the floating gate polysilicon layer 111.

In certain embodiments, the high-voltage polysilicon layer 121 may further have a second portion 121b, in which the second portion 121b of the high-voltage polysilicon layer 121 may be optionally extended along the upper surface 102 of the silicon substrate 101 and connected to the low-gate polysilicon layer 123. In these embodiments, the first structure 107 may optionally include the low-gate polysilicon layer 123 and the second portion 121b of the high-voltage polysilicon layer 121 disposed on the upper surface 102 of the silicon substrate 101.

In those embodiments, the floating gate polysilicon layer 111, the high-voltage polysilicon layer 121 and the low-gate polysilicon layer 123 may include a polysilicon material doped with common concentrations of various known impurities. In these embodiments, the second structure 109 may have a second height $H_2$ from the upper surface 102 of the silicon substrate 101 to a top surface (high-voltage polysilicon layer 121, and the second height $H_2$ is greater than the first height $H_1$. For example, a difference between the second height $H_2$ and the first height $H_1$ (i.e. the second height $H_2$ minus the first height $H_1$) divided by the first height $H_1$, i.e. $(H_2-H_1)/H_1$, may be greater than 3% and is greater than 10% in certain examples.

As shown in FIG. 1A, in some embodiments, the second structure 109 may include a limiting block 125 disposed on the top surface 121c of the high-voltage polysilicon layer 121 of the second structure 109 near an edge 121d of the second structure 109 beside the first structure 107. In certain embodiments, the limiting block 125 and the low-gate polysilicon layer 123 may be formed from the same material. In other embodiments, the limiting block 125 and the low-gate polysilicon layer 123 may be defined by the same reticle in the same step or by different reticles in different steps, depending on actual design requirements.

As shown in FIG. 1A, in some embodiments, a bottom anti-reflection coating (BARC) layer 135 may blanketly covers the first structure 107, the second structure 109 and the limiting block 125. In these embodiments, in which the BARC layer 135 in liquid state may include a low-viscosity material having a viscosity of no more than 5000 centipoise (cp), for example. It is noted that cp is an abbreviation of centipoise, 1 P=1 g·s$^{-1}$·cm$^{-1}$, viscosity unit: Pa·s=kg·m$^{-1}$·s$^{-1}$, therefore 1 Pa·s=10 P=1000 cP.

It is noted that, the limiting block 125 acts as a retaining wall to hold or restrain more of the BARC layer 135 on the top surface 121c and near the edge 121d of the second structure 109, for preventing the BARC layer 135 flowing down from the top surface 121c of the second structure 109. It keeps an external surface 137 of the BARC layer 135 overlying the top surface 121c of the second structure 109 to be substantially parallel to the top surface 121c of the second structure 109 along a horizontal dot line 139. That is to say, the BARC layer 135 has a substantially uniform thickness T above the top surface 121c as shown in FIG. 1A. Accordingly, the limiting block 125 may properly adjust the slope of the external surface 137 of the BARC layer 135 on the top surface 121c of the second structure 109. In certain examples, the limiting block 125 may decrease the slope of the external surface 137 of the BARC layer 135 approximately to zero on the top surface 121c of the second structure 109.

In some certain embodiments, the height of the limiting block 125 depends upon the difference between the second height $H_2$ and the first height $H_1$ (i.e. the second height $H_2$ minus the first height $H_1$) divided by the first height $H_1$, i.e. $(H_2-H_1)/H_1$, rather than limiting the height of the limiting block 125. It is noted that, when the difference between the second height $H_2$ and the first height $H_1$ (i.e. the second height $H_2$ minus the first height $H_1$) divided by the first height $H_1$, i.e. $(H_2-H_1)/H_1$, is greater than 10% in certain examples, the limiting block 125 has a height greater than another limiting block 125 when the difference between the second height $H_2$ and the first height $H_1$ (i.e. the second height $H_2$ minus the first height $H_1$) divided by the first height $H_1$, i.e. $(H_2-H_1)/H_1$, is greater than 10%. So that the limiting block 125 may hold or restrain much more of the BARC layer 135 on the top surface 121c and near the edge 121d of the second structure 109, for enhancing the prevention of the BARC layer 135 flowing down from the top surface 121c of the second structure 109.

As shown in FIG. 1A, in some embodiments, control gates 141a, 141b, 141c and 141d may be disposed on the external surface 137 of the BARC layer 135. Since the external surface 137 of the BARC layer 135 overlying the top surface 121c of the second structure 109 is extended along the horizontal dot-line 139 substantially parallel to the top surface 121c of the second structure 109, there is no or little differences in height of the control gates 141a, 141b, 141c and 141d. That is to say, the BARC layer 135 has a substantially uniform thickness T above the top surface 121c.

Referring to FIG. 1A, in other embodiments, other material layers maybe optionally disposed below the BARC layer 135 and above the first structure 107, the second structure 109 and the limiting block 125. In certain embodiments, an anti-reflection dielectric (ARD) layer 131 may be optionally disposed to blanketly cover the first structure 107, the second structure 109 and the limiting block 125. In certain embodiments, a passivation layer 133 may be optionally disposed to blanketly cover the ARD layer 131, in which the passivation layer 133 includes silicon oxynitride (SiON).

In other embodiments, the limiting block 125 may be combined with various structures, for effectively preventing the BARC layer 135 flowing down from the top surface 121c of the second structure 109, and keeping an external surface 137 of the BARC layer 135 overlying the top surface 121c of the second structure 109 to be substantially parallel to the top surface 121c of the second structure 109.

Figure 1B:
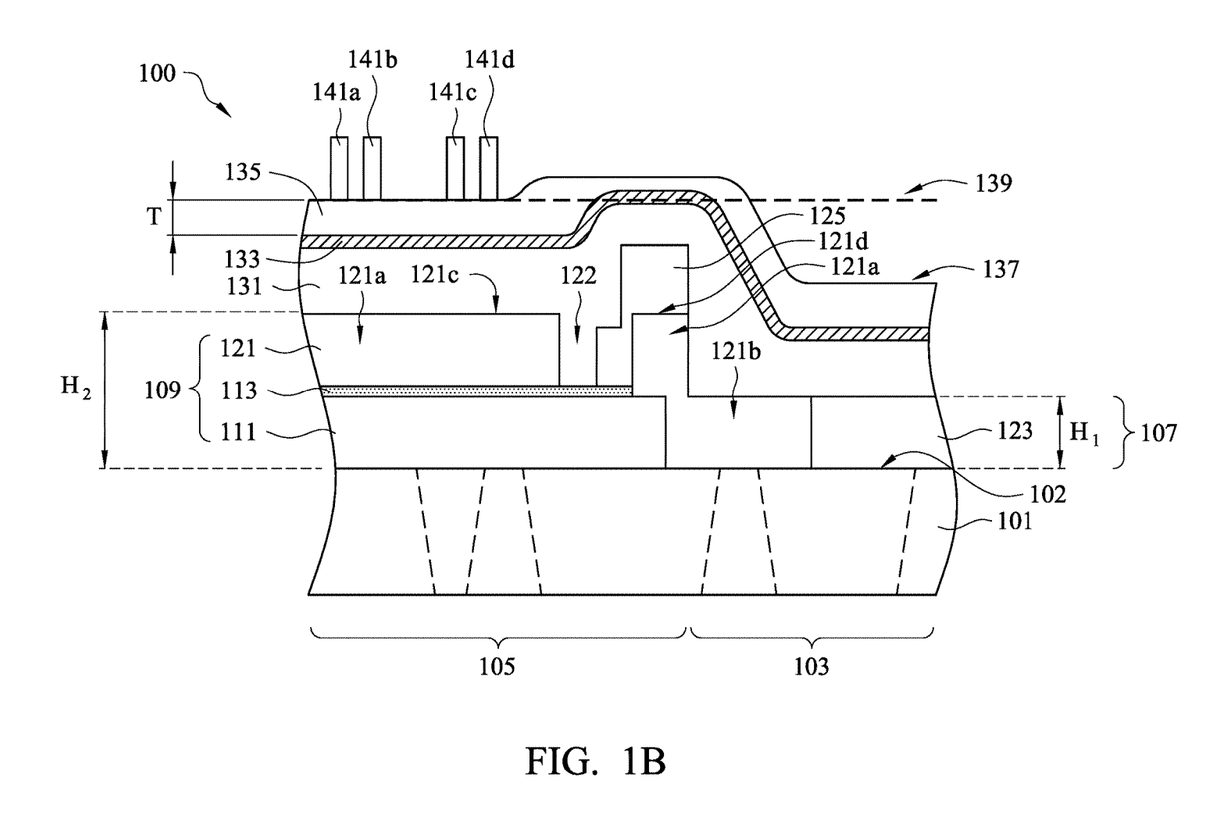

Referring to FIG. 1B. FIG. 1B is a schematic cross-sectional view of a semiconductor device having a multi-height structure in accordance with other embodiments. In other embodiments, as shown in FIG. 1B, the high-voltage polysilicon layer 121 of the second structure 109 may have a first portion 121a, in which the first portion 121a may be disposed on the floating gate polysilicon layer 111, and the first portion 121a may optionally have an opening 122 for exposing a portion of the dielectric layer 113. In these embodiments, a portion of the limiting block 125 may be disposed on the top surface 121c of the high-voltage polysilicon layer 121 of the second structure 109 near an edge 121d of the second structure 109 beside the first structure 107, and another portion of the limiting block 125 may extend into the opening 122. The another portion of the limiting block 125 may fill or partially fill the opening 122. The limiting block 125 acts as a retaining wall, and the opening 122 may receive a portion of the ARD layer 131 or a portion of the BARC layer 135 if the ARD layer 131 and passivation layer 133 are not disposed. The limiting block 125 and the opening 122 also may hold or restrain the BARC layer 135 on the top surface 121c and near the edge 121d of the second structure 109, for keeping the external surface 137 of the BARC layer 135 overlying the top surface 121c of the second structure 109 to be substantially parallel to the top surface 121c of the second structure 109 along a horizontal dot line 139. That is to say, the BARC layer 135 has a substantially uniform thickness T above the top surface 121c as shown in FIG. 1A. Accordingly, the limiting block 125 and the opening 122 also may freely adjust the slope of the external surface 137 of the BARC layer 135 on the top surface 121c of the second structure 109. In certain examples, the limiting block 125 and the opening 122 may decrease the slope of the external surface 137 of the BARC layer 135 on the top surface 121c of the second structure 109.

The semiconductor devices 100 of FIGS. 1A and 1B can be manufactured as follows. FIG. 2A to FIG. 2I are schematic cross-sectional views of intermediate stages showing a method of fabricating a semiconductor device 200 having a multi-height structure in accordance with various embodiments.

Figure 2A:
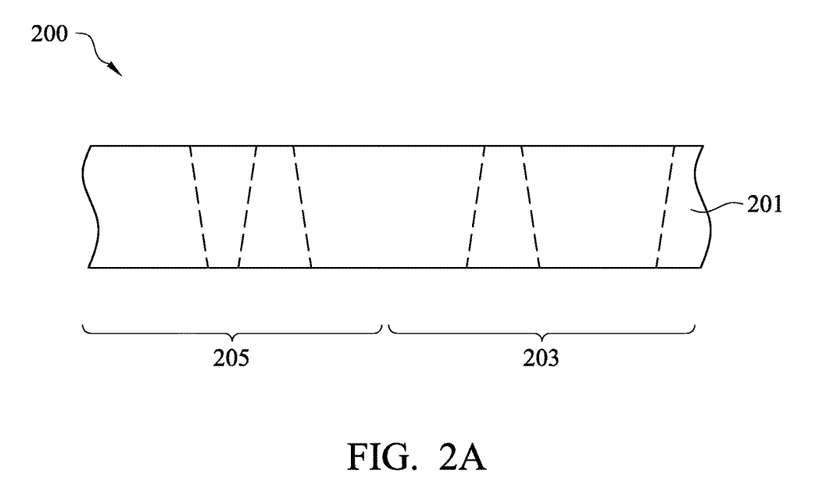
FIGS. 2A to 2I are schematic cross-sectional views of intermediate stages showing a method of fabricating a semiconductor device having a multi-height structure in accordance with various embodiments.

In some embodiments, as shown in FIG. 2A, the semiconductor device 200 may include a silicon substrate 201. In certain embodiments, the silicon substrate 201 may be defined into two areas, a first functional area 203 and a second functional area 205. In those embodiments, the first functional area 203 may be defined as a logic cell area, and the second functional area 205 may be defined as a flash cell area. In those embodiments, the silicon substrate 201 may include structures such as shallow trench isolations (STIs) (not shown in the figures) to define areas for active devices, sometimes referred as OD areas (not shown in the figures).

Figure 2B:
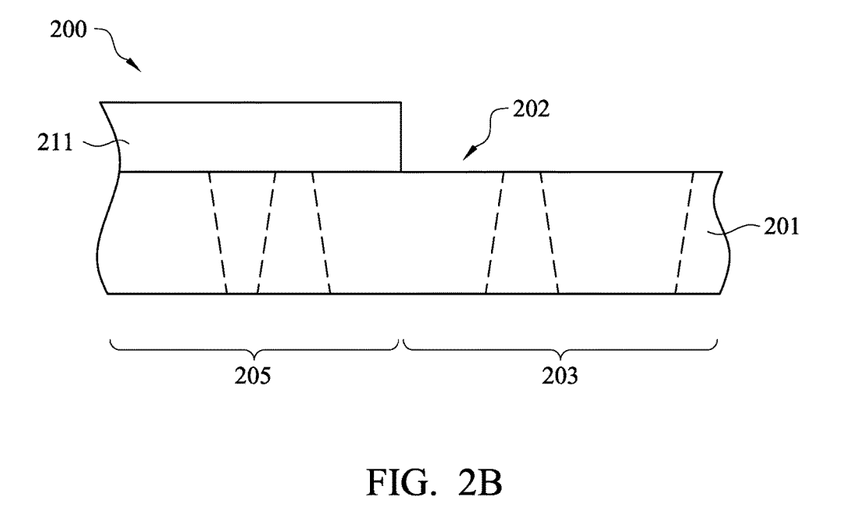

In some embodiments, as shown in FIG. 2B, the semiconductor device 200 may include a low-gate polysilicon layer 211 above an upper surface 202 of a silicon substrate 201 within the second functional area 205. In certain embodiments, the low-gate polysilicon layer 211 may be made from polysilicon or other appropriate conducting materials, which may be formed by a typical process, such as chemical vapor deposition (CVD) process.

Figure 2C:
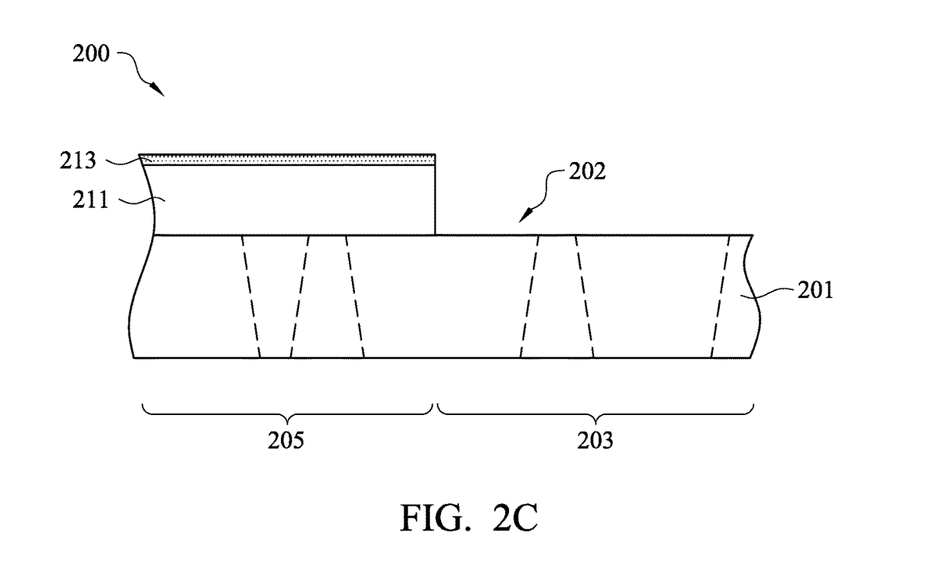

In some embodiments, as shown in FIG. 2C, a dielectric layer 213 may be optionally formed on the floating gate polysilicon layer 211.

Figure 2D:
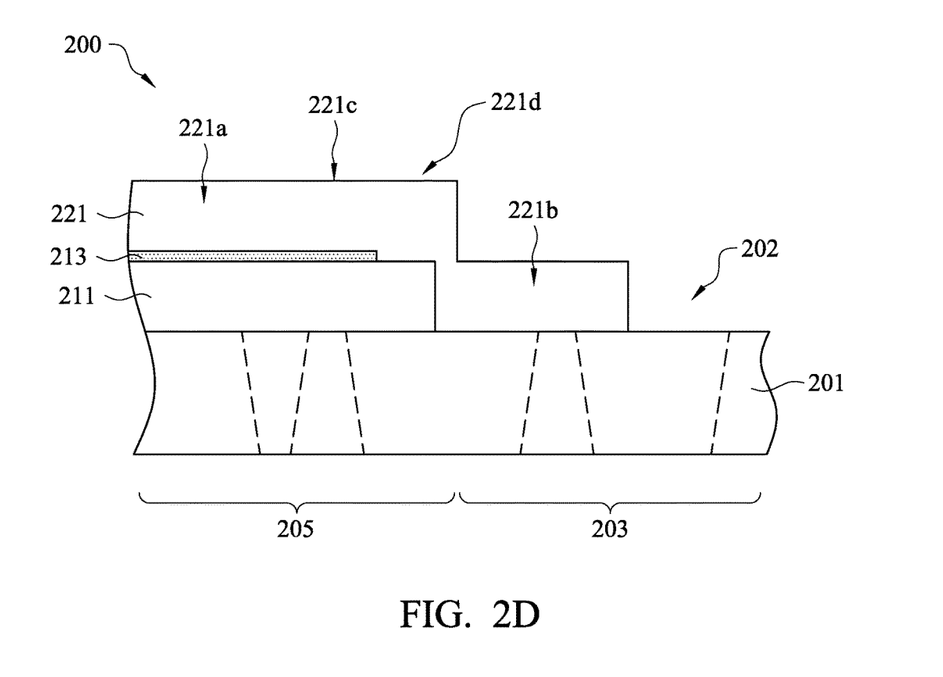

In some embodiments, as shown in FIG. 2D, a high-voltage polysilicon layer 221 may be formed on the dielectric layer 213 and the floating gate polysilicon layer 211. In certain embodiments, the high-voltage polysilicon layer 221 may have a first portion 221a formed on the floating gate polysilicon layer 211, a second portion 221b optionally extending along the upper surface 202 of the silicon substrate 201.

Figure 2E:
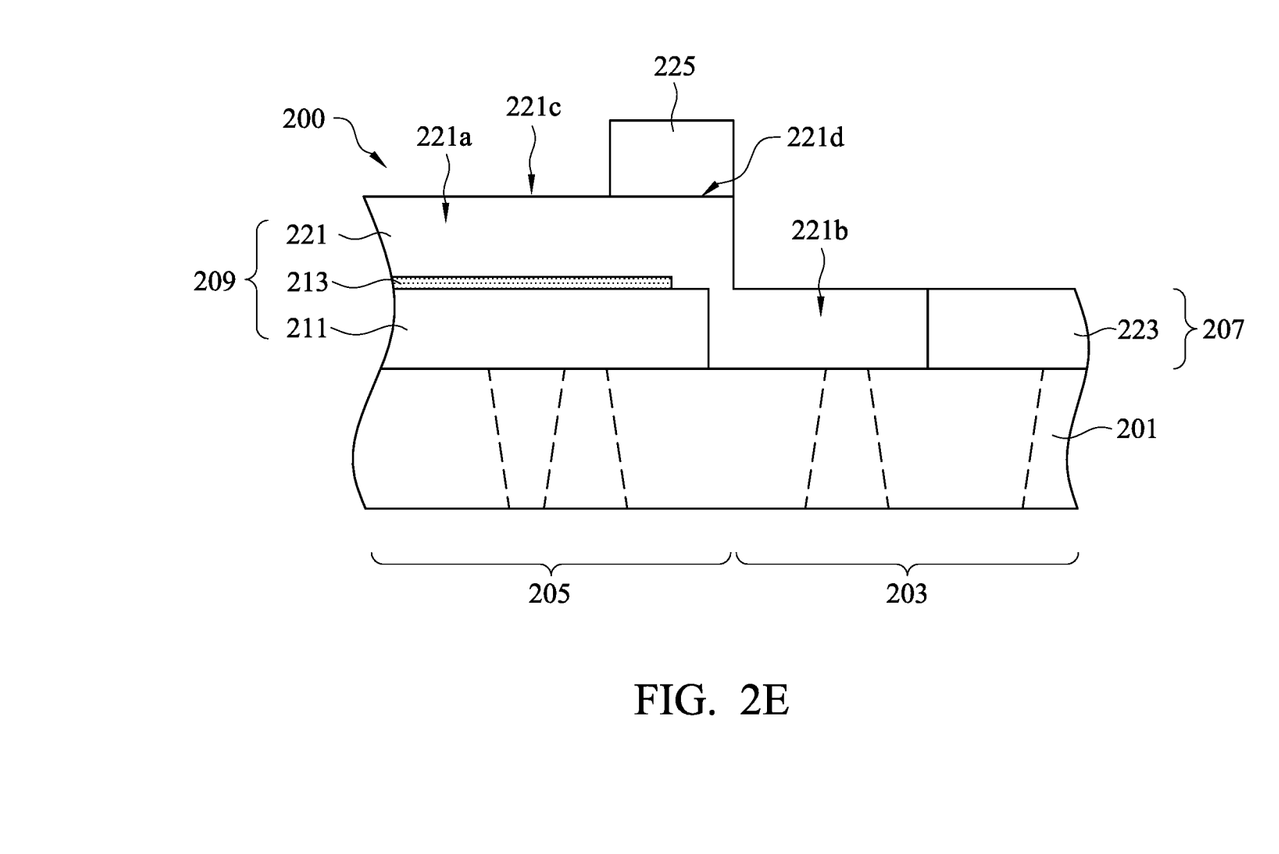

In some embodiments, as shown in FIG. 2E, a low-gate polysilicon layer 223 may be formed the upper surface 202 of the silicon substrate 201 within the first functional area 203 and connected to the second portion 221b of the high-voltage polysilicon layer 221. Simultaneously, a limiting block 225 may be formed on a top surface 221c of the high-voltage polysilicon layer 221 and near an edge 221d thereof beside the low-gate polysilicon layer 223. For saving the processing steps, in some embodiments, the limiting block 225 and the low-gate polysilicon layer 223 may be defined by the same reticle in the same processing step or by different reticles in different processing steps.

In certain embodiments, the low-gate polysilicon layer 223 and the second portion 221b of the high-voltage polysilicon layer 221 may be defined as a first structure 207. The first portion 221a of the high-voltage polysilicon layer 221, the low-gate polysilicon layer 211 and optionally the dielectric layer 213 may be defined as a second structure 209.

Figure 2F:
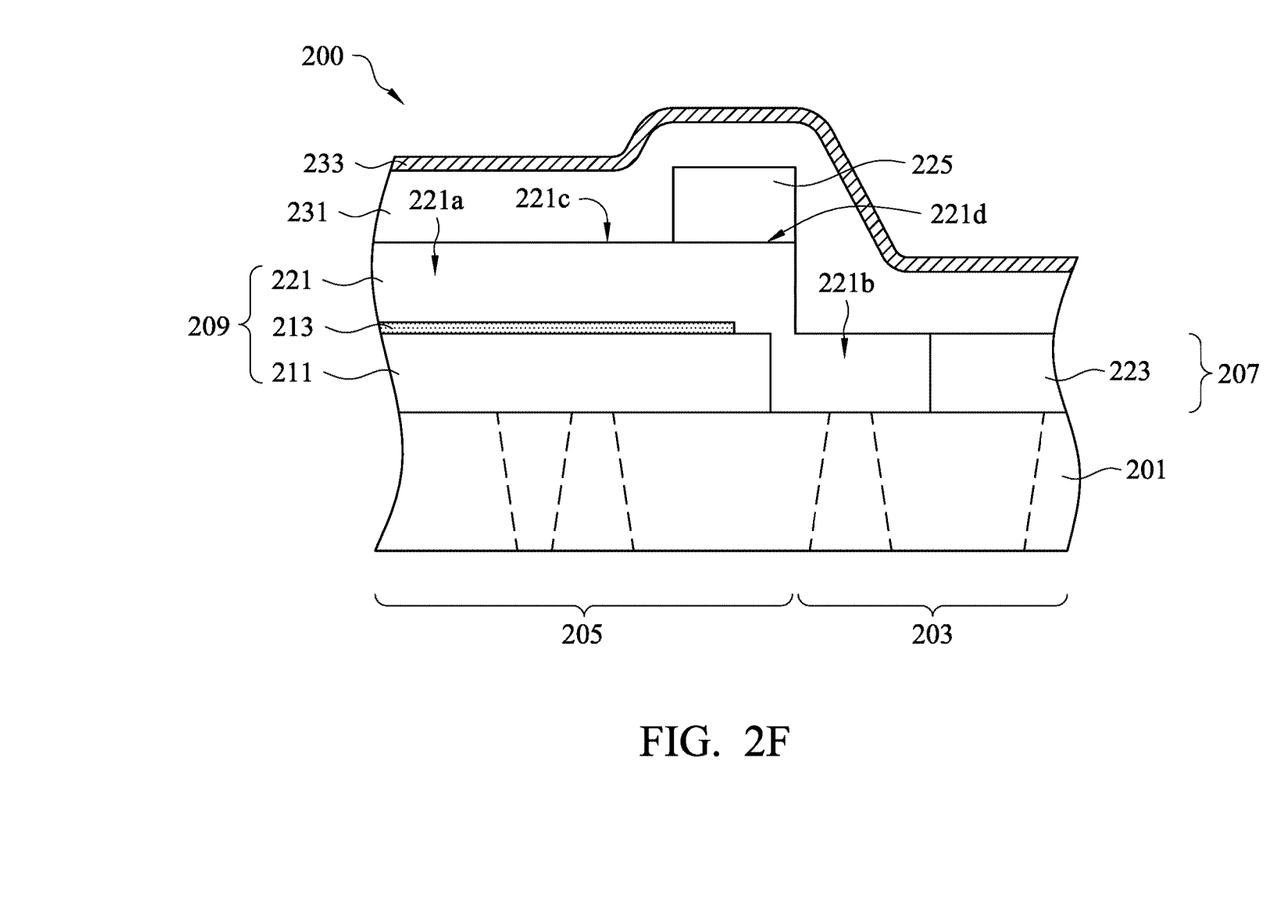

In some embodiments, as shown in FIG. 2F, an ARD layer 231 may optionally blanketly cover the first structure 207, the limiting block 225 and the second structure 209. Then, a passivation layer 233, including silicon oxynitride (SiON), may optionally blanketly cover the ARD layer 231. Alternatively, in the case of FIG. 2I, an opening 222 may be optionally formed in the first portion 221a of the high-voltage polysilicon layer 221 for exposing a portion of the dielectric layer 213. In these embodiments, a portion of the limiting block 225 may be disposed on the top surface 221c of the high-voltage polysilicon layer 221 of the second structure 209 near an edge 221d of the second structure 209 beside the first structure 207, and another portion of the limiting block 225 may extend into the opening 222, for fulfilling the opening 222 or partially.

Figure 2G:
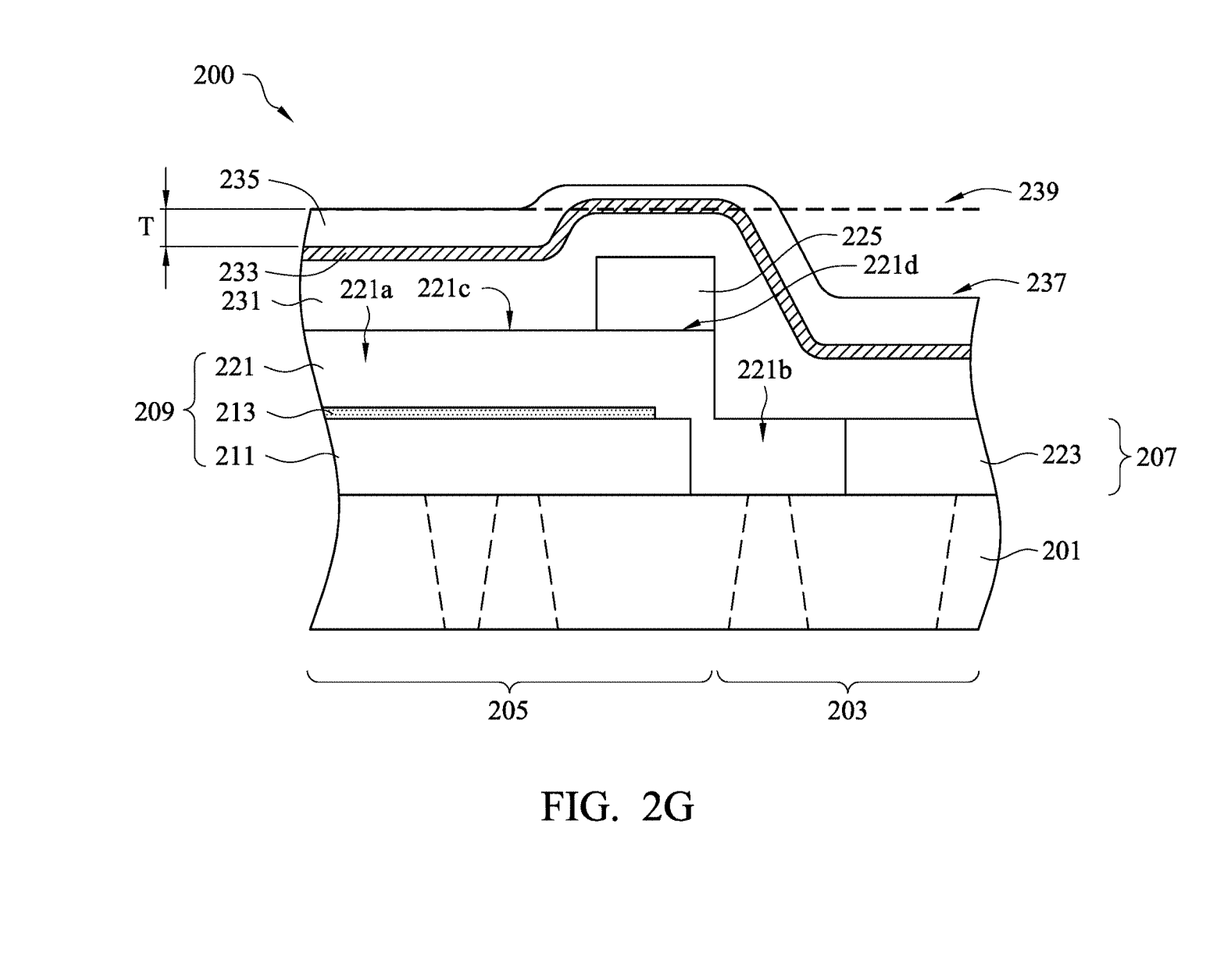

In some embodiments, as shown in FIG. 2G, a BARC layer 235 may blanketly cover the passivation layer 233. In some embodiments, the BARC layer 235 in liquid phase may include a low-viscosity material having a viscosity smaller than or equal to 5000 centipoise (cp), for example. The BARC layer 235 may be applied on the passivation layer 233 by a typical spin coating process. It is noted that cp is an abbreviation of centipoise, 1 P=1 g·s$^{-1}$·cm$^{-1}$, viscosity unit: Pa·s$^{-1}$=kg·m$^{-1}$ s$^{-1}$, therefore 1 Pa·s=10 P=1000 cP.

It is noted that, the limiting block 225, acting as a retaining wall, may be used to hold or restrain more of the BARC layer 235 on the top surface 221c and near the edge 221d of the second structure 209, for preventing the BARC layer 235 flowing down from the top surface 221c of the second structure 209. It keeps an external surface 237 of the BARC layer 235 overlying the top surface 221c of the second structure 209 to be substantially parallel to the top surface 221c of the second structure 209 along a horizontal dot line 239. That is to say, the limiting block 225 has a substantially uniform thickness T above the top surface 221c and appropriately adjusts the slope of the external surface 237 of the BARC layer 235 on the top surface 221c of the second structure 209. In certain examples, the limiting block 225 may decrease the slope of the external surface 237 of the BARC layer 235 approximately to zero on the top surface 221c of the second structure 209.

Figure 2H:
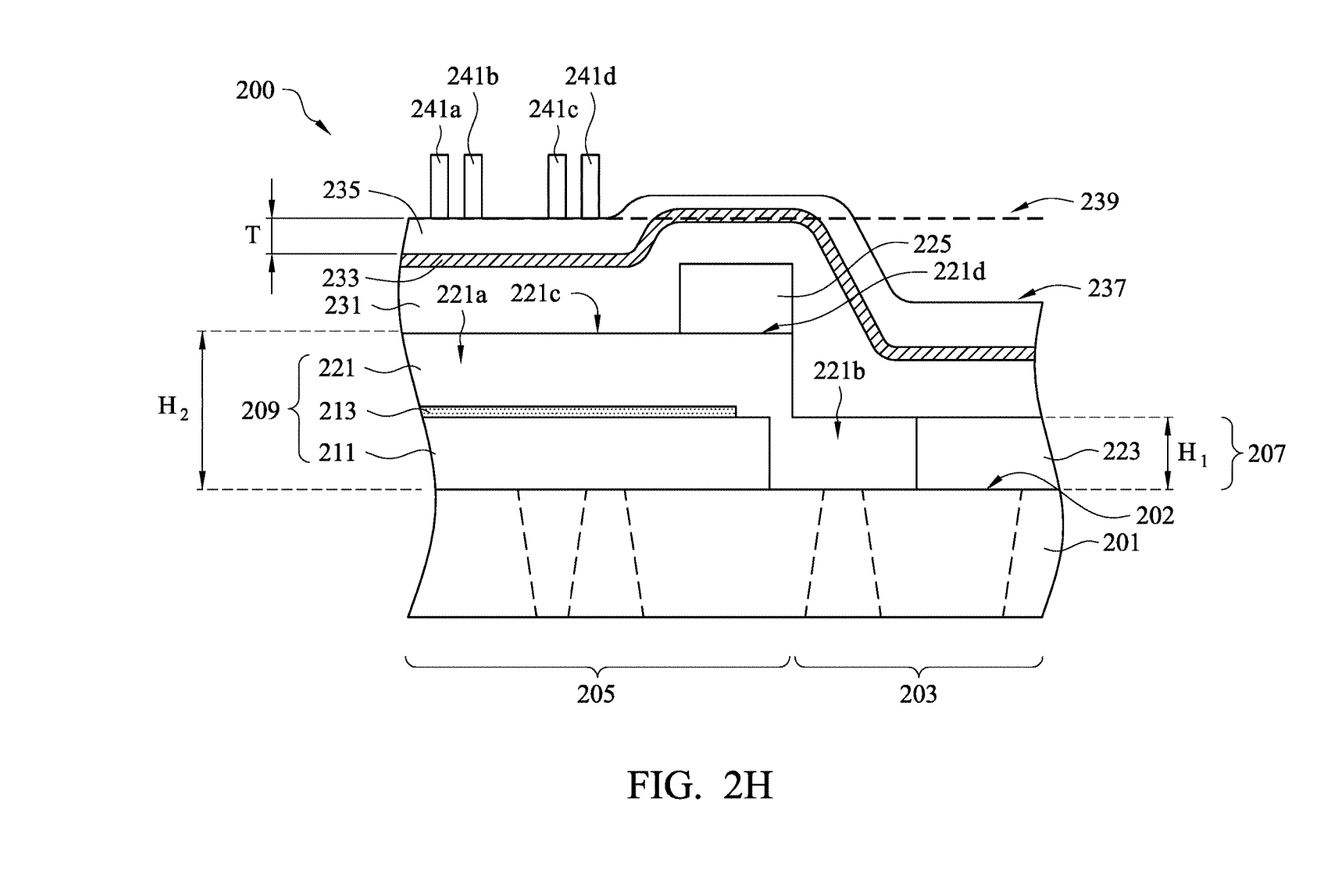

In some embodiments, as shown in FIG. 2H, control gates 241a, 241b, 241c and 241d may be disposed on the external surface 237 of the BARC layer 235 at substantially the same horizontal level.

In some examples, a difference between the second height $H_2$ and the first height $H_1$ (i.e. the second height $H_2$ minus the first height $H_1$) divided by the first height $H_1$, i.e. $(H_2-H_1)/H_1$, is greater than 3%, and is greater than 10% in certain examples. The standard derivation in height of all control gates of the semiconductor device 200 may have a mean of less than 2.6 and a standard derivation of less than 0.26 when the semiconductor device 200 has the limiting block 225 and/or the opening 222. In certain examples, the standard derivation in height of all control gates of the semiconductor device 200 may have a mean of less than 2.4 and a standard derivation of less than 0.20 when the semiconductor device 200 has the limiting block 225 and/or the opening 222. In other certain examples, the standard derivation in height of all control gates of the semiconductor device 200 may have a mean of less than 2.2 and a standard derivation of less than 0.16 when the semiconductor device 200 has the limiting block 225 and/or the opening 222 (data not shown in the figures). The semiconductor device 200 of FIGS. 2H and 2I may have improved (i.e. larger) CD near the edge 221d of the second functional area 205 (for example, the flash cell area).

Figure 2I:
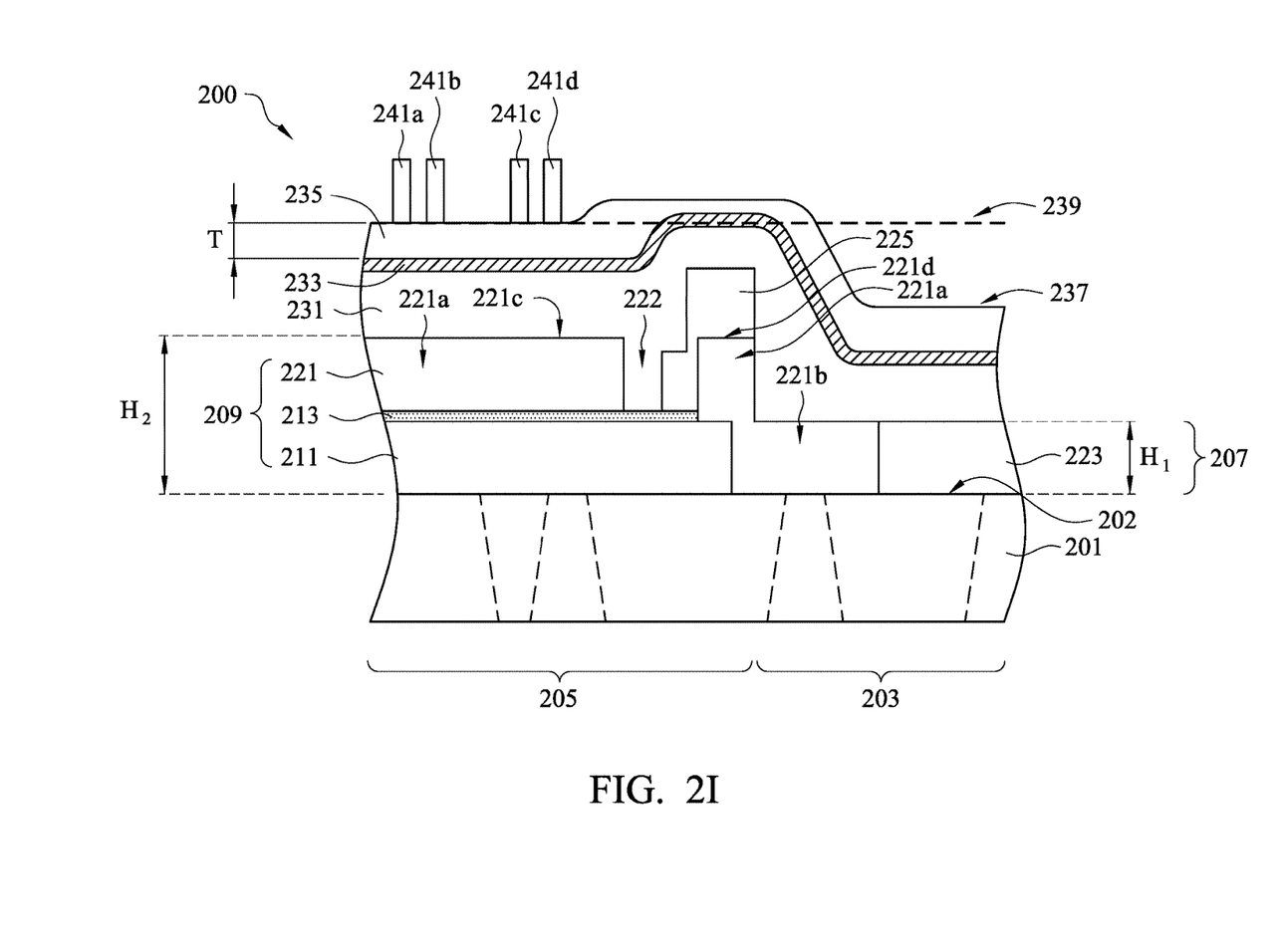

Referring to FIG. 2I. FIG. 2I is a schematic cross-sectional view of a semiconductor device having a multi-height structure in accordance with other embodiments. In other embodiments, as shown in FIG. 2I, the high-voltage polysilicon layer 221 of the second structure 209 may have a first portion 221a, in which the first portion 221a may be disposed on the floating gate polysilicon layer 211, and the first portion 221a may optionally have an opening 222 for exposing a portion of the dielectric layer 213. In these embodiments, a portion of the limit block 225 may be disposed on the top surface 221c of the high-voltage polysilicon layer 221 of the second structure 209 near an edge 221d of the second structure 209 beside the first structure 207, and another portion of the limit block 225 may extend into the opening 222. The another portion of the limit block 225 may be filled into the opening 222 or not. The limit block 225 is like a retaining wall, and the opening 222 may receive a portion of the BARC layer 235. The limit block 225 and the opening 222 also may hold or restrain the BARC layer 235 on the top surface 221c of the second structure 209, for keeping the external surface 237 of the BARC layer 235 overlying the top surface 221c of the second structure 209 to be substantially parallel to the top surface 221c of the second structure 209 along a horizontal dot line 239. Accordingly, the limit block 225 and the opening 222 also may freely adjust the slope of the external surface 237 of the BARC layer 235 on the top surface 221c of the second structure 209. In certain examples, the limit block 225 and the opening 222 may decrease the slope of the external surface 237 of the BARC layer 235 on the top surface 221c of the second structure 209.

In comparison with the typical semiconductor device without the limiting block and/or the opening, when a BARC layer includes a low-viscosity material, an external surface of the BARC layer overlying various features shows a steep slope from a central portion to the edge of a functional area, the BARC layer is unlikely held or restrained on the top surface of the underlying various features. Moreover, for example, the BARC layer overlying the top surface of the underlying various features within a functional area has a mean of more than 2.6 and a standard derivation of more than 0.26, and the critical dimension uniformity (CDU) of the semiconductor device within the functional area become worse, leading smaller CD at the edge of the underlying various features (for example, the flash cell area). However, the semiconductor device 200 having the limiting block 225 (e.g. FIG. 2H) and/or the opening 222 within the second functional area 205 (e.g. FIG. 2I) may improve approximately 25% CDU in comparison with the semiconductor device within the functional area.

In accordance with an embodiment, the present disclosure discloses a semiconductor device having a multi-height structure. The semiconductor device may include a silicon substrate, a first structure, a second structure, a bottom anti-reflection coating (BARC) layer and control gates. The first structure may be disposed on the silicon substrate, in which the first structure has a first height from an upper surface of the silicon substrate. The second structure may be disposed on the silicon substrate and adjacent to the first structure, in which the second structure may have a second height more than the first height from the upper surface of the silicon substrate, and the second structure may include a limiting block disposed on a top surface of the second structure near an edge of the second structure beside the first structure. The bottom anti-reflection coating (BARC) layer may cover the first structure, the second structure and the limiting block, in which the BARC layer may include a low-viscosity material, and the BARC layer overlying the top surface of the second structure may have an external surface substantially parallel to the top surface of the second structure. The control gates may be disposed on the external surface of the BARC layer.

In accordance with another embodiment, the present disclosure discloses a semiconductor device having a multi-height structure. The semiconductor device may include a first structure, a second structure, an anti-reflection dielectric (ARD) layer, a BARC layer and control gates. The first structure may be disposed on a silicon substrate, in which the first structure may have a first height from an upper surface of the silicon substrate. The second structure may be disposed on the silicon substrate and adjacent to the first structure, in which the second structure may have a second height more than the first height from the upper surface of the silicon substrate, and the second structure may include a limiting block disposed on a top surface of the second structure near an edge of the second structure beside the first structure. The ARD layer may cover the first structure, the second structure and the limiting block. The BARC layer may cover the ARD layer, in which the BARC layer may include a low-viscosity material, and the BARC layer above the top surface of the second structure may have an external surface substantially parallel to the top surface of the second structure. The control gates may be disposed on the external surface of the BARC layer.

In accordance with yet another embodiment, the present disclosure discloses a semiconductor device having a multi-height structure. The semiconductor device may include a first structure, a second structure, an ARD layer, a passivation layer, a BARC layer and control gates. The first structure may be disposed on the silicon substrate, in which the first structure may have a first height from an upper surface of the silicon substrate. The second structure may be disposed on the silicon substrate and adjacent to the first structure, in which the second structure may have a second height more than the first height from the upper surface of the silicon substrate, and the second structure may include a limiting block disposed on a top surface of the second structure near an edge of the second structure beside the first structure. The ARD layer may cover the first structure, the second structure and the limiting block. The passivation layer may cover the ARD layer, in which the passivation layer may include silicon oxynitride (SiON). The BARC layer may cover the passivation layer, in which the BARC layer may include a low-viscosity material, and the BARC layer above the top surface of the second structure may have an external surface substantially parallel to the top surface of the second structure. The control gates may be disposed on the external surface of the BARC layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device having a multi-height structure, comprising:
   a silicon substrate;
   a first structure disposed on the silicon substrate, wherein the first structure has a first height from an upper surface of the silicon substrate; and
   a second structure disposed on the silicon substrate and adjacent to the first structure, wherein the second structure has a second height more than the first height from the upper surface of the silicon substrate, and the second structure comprises a limiting block disposed on a top surface of the second structure near an edge of the second structure beside the first structure;
   a bottom anti-reflection coating (BARC) layer covering the first structure, the second structure and the limiting block, wherein the BARC layer comprises a low-viscosity material, and
   a plurality of control gates disposed on an external surface of the BARC layer.

2. The semiconductor device of claim 1, wherein the first structure includes a low gate polysilicon layer.

3. The semiconductor device of claim 1, wherein the second structure further comprises:
   a floating gate polysilicon layer disposed on the silicon substrate; and
   a high-voltage polysilicon layer having a first portion and a second portion connected to the first portion, wherein the first portion is disposed on the floating gate polysilicon layer.

4. The semiconductor device of claim 3, wherein the second portion is extended along the upper surface of the silicon substrate and connected to the low gate polysilicon layer.

5. The semiconductor device of claim 4, wherein the first structure includes the low gate polysilicon layer and the second portion of the high-voltage polysilicon layer disposed on the silicon substrate.

6. The semiconductor device of claim 4, wherein the limiting block and the low gate polysilicon layer are the same material.

7. A semiconductor device having a multi-height structure, comprising:
   a first structure disposed on a silicon substrate, wherein the first structure has a first height from an upper surface of the silicon substrate; and
   a second structure disposed on the silicon substrate and adjacent to the first structure, wherein the second structure has a second height more than the first height from the upper surface of the silicon substrate, and the second structure comprises a limiting block disposed on a top surface of the second structure near an edge of the second structure beside the first structure;
   an anti-reflection dielectric (ARD) layer covering the first structure, the second structure and the limiting block;
   a BARC layer covering the ARD layer, wherein the BARC layer comprises a low-viscosity material e; and
   a plurality of control gates disposed on the external surface of the BARC layer.

8. The semiconductor device of claim 7, wherein the first structure includes a low gate polysilicon layer.

9. The semiconductor device having a multi-height structure of claim 7, wherein the second structure further comprises:
   a floating gate polysilicon layer disposed on the silicon substrate; and
   a high-voltage polysilicon layer having a first portion and a second portion connected to the first portion, wherein the first portion is disposed on the floating gate polysilicon layer.

10. The semiconductor device of claim 9, wherein the second portion is extended along the upper surface of the silicon substrate and connected to the low gate polysilicon layer.

11. The semiconductor device of claim 10, wherein the first structure includes the low gate polysilicon layer and the second portion of the high-voltage polysilicon layer disposed on the silicon substrate.

12. The semiconductor device of claim 10, wherein the limiting block and the low gate polysilicon layer are the same material.

13. The semiconductor device of claim 7, wherein a passivation layer is disposed between the ARD layer and the BARC layer.

14. The semiconductor device of claim 13, wherein the passivation layer comprises silicon oxynitride (SiON).

15. A semiconductor device having a multi-height structure, comprising:
   a first structure disposed on a silicon substrate, wherein the first structure has a first height from an upper surface of the silicon substrate; and
   a second structure disposed on the silicon substrate and adjacent to the first structure, wherein the second structure has a second height more than the first height from the upper surface of the silicon substrate, and the second structure comprises a limiting block disposed on a top surface of the second structure near an edge of the second structure beside the first structure;
   an ARD layer covering the first structure, the second structure and the limiting block;
   a passivation layer covering the ARD layer, wherein the passivation layer comprises silicon oxynitride (SiON);
   a BARC layer covering the passivation layer, wherein the BARC layer comprises a low-viscosity material, and the BARC layer above the top surface of the second structure has an external surface substantially parallel to the top surface of the second structure; and
   a plurality of control gates disposed on the external surface of the BARC layer.

16. The semiconductor device of claim 15, wherein the first structure includes a low gate polysilicon layer.

17. The semiconductor device of claim 15, wherein the second structure further comprises:
   a floating gate polysilicon layer disposed on the silicon substrate; and
   a high-voltage polysilicon layer having a first portion and a second portion connected to the first portion, wherein the first portion is disposed on the floating gate polysilicon layer.

18. The semiconductor device of claim 17, wherein the second portion is extended along the upper surface of the silicon substrate and connected to the low gate polysilicon layer.

19. The semiconductor device of claim 17, wherein the first structure includes the low gate polysilicon layer and the second portion of the high-voltage polysilicon layer disposed on the silicon substrate.

20. The semiconductor device of claim 15, wherein the limiting block and the low gate polysilicon layer are the same material.

* * * * *